(12) United States Patent
Noto et al.

(10) Patent No.: US 10,749,492 B2
(45) Date of Patent: Aug. 18, 2020

(54) PIEZOELECTRIC VIBRATION COMPONENT AND METHOD FOR MANUFACTURING THE SAME

(71) Applicant: Murata Manufacturing Co., Ltd., Nagaokakyo-shi, Kyoto-fu (JP)

(72) Inventors: Kazuyuki Noto, Nagaokakyo (JP); Keiichi Kami, Nagaokakyo (JP); Hidekazu Oishibashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 435 days.

(21) Appl. No.: 15/631,451

(22) Filed: Jun. 23, 2017

(65) Prior Publication Data

US 2017/0288522 A1 Oct. 5, 2017

Related U.S. Application Data

(63) Continuation of application No. PCT/JP2015/075417, filed on Sep. 8, 2015.

(30) Foreign Application Priority Data

Jan. 8, 2015 (JP) .................................. 2015-002484

(51) Int. Cl.
*H03H 9/17* (2006.01)
*H03H 3/02* (2006.01)
(Continued)

(52) U.S. Cl.
CPC ............... *H03H 3/02* (2013.01); *H01L 23/10* (2013.01); *H03H 9/0519* (2013.01);
(Continued)

(58) Field of Classification Search
CPC .......................... H03H 9/0519; H03H 9/1021
See application file for complete search history.

(56) References Cited

U.S. PATENT DOCUMENTS

| 2004/0094320 A1* | 5/2004 | Goto | ....................... H01L 23/04 174/50.51 |
| 2012/0067611 A1* | 3/2012 | Kohda | ................. H03H 9/1021 174/50.54 |

(Continued)

FOREIGN PATENT DOCUMENTS

| JP | S60-20146 U | 2/1985 |
| JP | H09-307396 A | 11/1997 |

(Continued)

OTHER PUBLICATIONS

International Search Report issued in International Application No. PCT/JP2015/075417, dated Oct. 20, 2015.
(Continued)

*Primary Examiner* — J. San Martin
(74) *Attorney, Agent, or Firm* — Arent Fox LLP

(57) ABSTRACT

A lid and an insulating bonding layer that seal a piezoelectric vibrator on a substrate are bonded with higher strength. A piezoelectric vibration component includes a substrate having a principal surface on which a piezoelectric vibrator is mounted, an insulating film disposed on the principal surface, a lid having a recess opening toward the principal surface and an edge portion around the recess. Moreover, first and second insulating bonding layers are interposed between the lid and the substrate. The first and second insulating bonding layers are joined together between the edge portion and the insulating film so as to seal the piezoelectric vibrator in a space between the recess and the principal surface.

8 Claims, 5 Drawing Sheets

(51) Int. Cl.
*H03H 9/05* (2006.01)
*H03H 9/10* (2006.01)
*H01L 23/10* (2006.01)

(52) U.S. Cl.
CPC . *H03H 9/1021* (2013.01); *H01L 2224/16225* (2013.01); *H01L 2924/0002* (2013.01); *H01L 2924/16152* (2013.01); *H03H 2003/022* (2013.01)

(56) References Cited

U.S. PATENT DOCUMENTS

| | | | | |
|---|---|---|---|---|
| 2012/0174360 A1* | 7/2012 | Sato | ................ | H03H 9/1021 29/25.35 |
| 2013/0057355 A1* | 3/2013 | Yoshida | ............ | H03H 9/0519 331/158 |
| 2014/0028155 A1* | 1/2014 | Oishibashi | .......... | H01L 41/09 310/365 |
| 2014/0292143 A1 | 10/2014 | Ichikawa | | |
| 2014/0346930 A1* | 11/2014 | Kohda | ............. | H01L 41/0533 310/344 |
| 2015/0001997 A1* | 1/2015 | Saito | ............. | H03H 3/02 310/344 |
| 2015/0015118 A1* | 1/2015 | Kamijo | .............. | H03H 9/1021 310/344 |
| 2015/0054385 A1* | 2/2015 | Kaida | ................. | H03H 9/1021 310/344 |
| 2016/0028348 A1* | 1/2016 | Kushida | ................. | H03H 9/19 331/158 |

FOREIGN PATENT DOCUMENTS

| | | |
|---|---|---|
| JP | 2003-218662 A | 7/2003 |
| JP | 2013-62712 A | 4/2013 |
| JP | 2013-168863 A | 8/2013 |
| JP | 2014-197615 A | 10/2014 |

OTHER PUBLICATIONS

Written Opinion of the International Searching Authority issued in International Application No. PCT/JP2015/075417, dated Oct. 20, 2015.

* cited by examiner

US 10,749,492 B2

PIEZOELECTRIC VIBRATION COMPONENT AND METHOD FOR MANUFACTURING THE SAME

CROSS REFERENCE TO RELATED APPLICATIONS

The present application is a continuation of PCT/JP2015/075417 filed Sep. 8, 2015, which claims priority to Japanese Patent Application No. 2015-002484, filed Jan. 8, 2015, the entire contents of each of which are incorporated herein by reference.

TECHNICAL FIELD

The present disclosure relates to a piezoelectric vibration component and a method for manufacturing the same.

BACKGROUND

Piezoelectric vibrators have been widely used as oscillators or bandpass filters. For example, Japanese Unexamined Patent Application Publication No. 2013-62712 (hereinafter "Patent Document 1") discloses, as a form of an existing piezoelectric vibrator, a surface mount quartz vibrator having a structure in which a quartz vibrator is sealed from the outside air. The surface mount quartz vibrator disclosed in Patent Document 1 includes a ceramic substrate on which a quartz vibrator is mounted, an insulating film disposed round on the surface of the ceramic substrate so as to surround the quartz vibrator, a sealant formed from a resin or other material and superposed on the insulating film, and a metal lid joined to the ceramic substrate with the insulating film and the sealant interposed therebetween. The metal lid is bonded to the ceramic substrate with pressure while the sealant is heated to melt. The quartz vibrator can thus be sealed in the metal lid disclosed in Patent Document 1.

However, bonding the metal lid to the ceramic substrate with pressure while heating the sealant to melt may cause a gap between the sealant and the metal lid while the sealant is heated. If this gap expands, the sealant and the metal lid may be bonded with small bonding strength and the metal lid may be detached from the ceramic substrate.

SUMMARY

The present disclosure has been made in view of the above-described circumstances and enhances bonding strength between a lid and an insulating bonding layer that seal a piezoelectric vibrator on a substrate.

A piezoelectric vibration component according to an exemplary aspect includes a substrate having a principal surface on which a piezoelectric vibrator is mounted, an insulating film disposed on the principal surface, a lid having a recess opening toward the principal surface and an edge portion around the recess. Moreover, a first insulating bonding layer and a second insulating bonding layer are interposed between the lid and the substrate. The first and second insulating bonding layers are joined together between the edge portion and the insulating film so as to seal the piezoelectric vibrator in a space between the recess and the principal surface.

The present disclosure is capable of increasing bonding strength between a lid and an insulating bonding layer that seal a piezoelectric vibrator on a substrate.

DETAILED DESCRIPTION

Exemplary embodiments of the present disclosure are described below with reference to the drawings.

Figure 1:
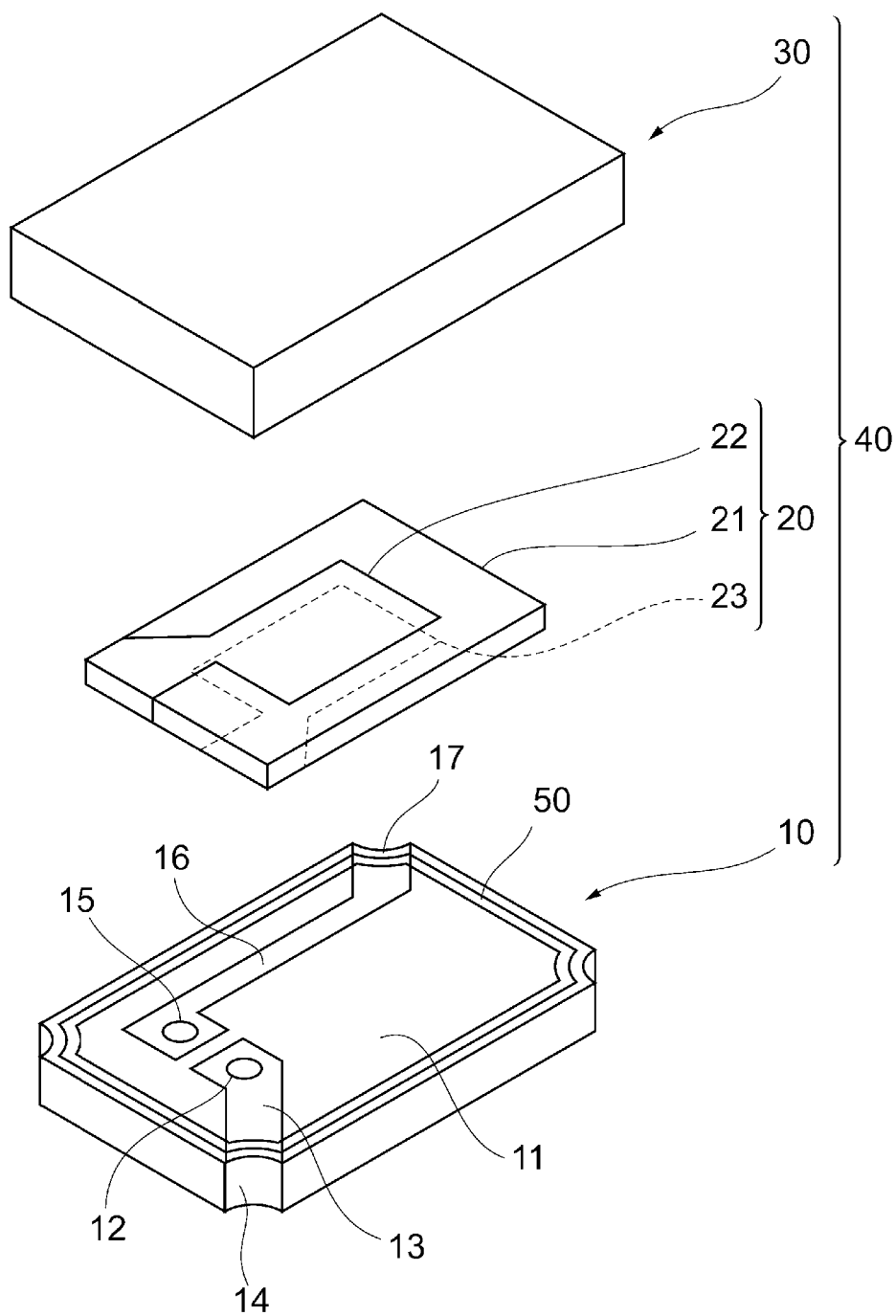
FIG. 1 is an exploded perspective view of a piezoelectric vibration component according to an exemplary embodiment.

FIG. 1 is an exploded perspective view of a piezoelectric vibration component 40 according to an exemplary embodiment. As illustrated in the drawing, the piezoelectric vibration component 40 mainly includes a piezoelectric vibrator 20, a substrate 10 having a main or principal surface 11 on which the piezoelectric vibrator 20 is mounted, and a lid 30 that hermitically seals the piezoelectric vibrator 20 from the outside air. The piezoelectric vibrator 20 includes a flat piezoelectric plate 21 having two surfaces opposing in the thickness direction, an excitation electrode 22 on one of the surfaces of the piezoelectric plate 21, and an excitation electrode 23 on the other surface of the piezoelectric plate 21. When an AC voltage is applied across the excitation electrodes 22 and 23, the piezoelectric plate 21 oscillates in a thickness shear mode. The piezoelectric plate 21 is formed from a piezoelectric material (such as a quartz plate or piezoelectric ceramics). The excitation electrodes 22 and 23 are conductive thin films made of, for example, gold, chromium, nickel, aluminum, or titanium.

The substrate 10 is a flat plate having two surfaces opposing in the thickness direction. Of the two surfaces, the surface on which the piezoelectric vibrator 20 is mounted is referred to as the principal surface 11. A wire 13 electrically connected to the excitation electrode 23 through a conductive adhesive 12, a wire 16 electrically connected to the excitation electrode 22 through a conductive adhesive 15, and an insulating film 50 that secures electrical insulation between the wires 13 and 16 and the lid 30 are disposed on the principal surface 11. The insulating film 50 is formed in a substantially continuous rectangle (i.e., in a substantially rectangular frame) so as to surround the piezoelectric vibrator 20. For example, the insulating film 50 can be a thin glass film according to one aspect. The thin glass film has high electric insulation properties. The substrate 10 is formed from a material having appropriate mechanical strength and appropriate electric insulation properties (for example, insulating ceramics such as alumina, a synthetic resin, or a composite formed by coating the surface of a metal plate with an insulating layer). The substrate 10 has indentations 14 and 17, formed by partially cutting corner portions so as to have a cylindrical curved surface. The wires 13 and 16 respectively extend from the indentations 14 and 17 to the surface opposite to the principal surface 11 so as to be connectable to an outside circuit.

Figure 6:
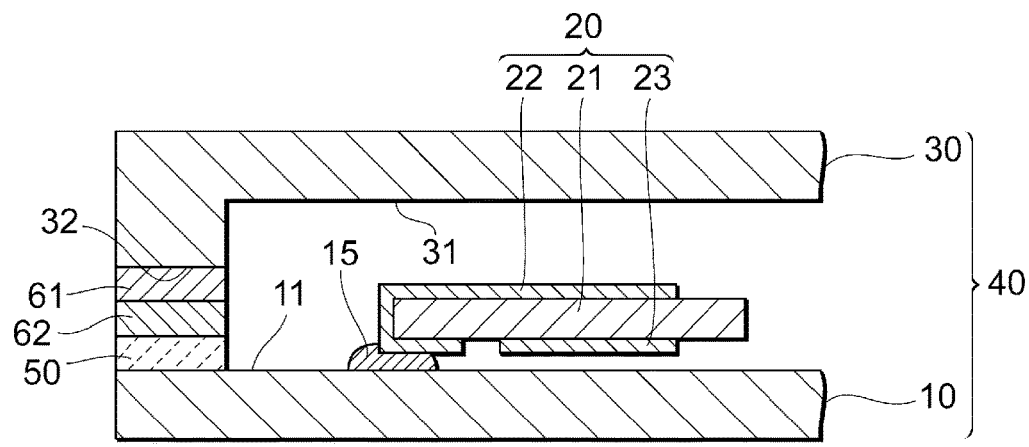
FIG. 6 is a partial sectional view of a process of manufacturing a piezoelectric vibration component according to an exemplary embodiment.
Figure 8:
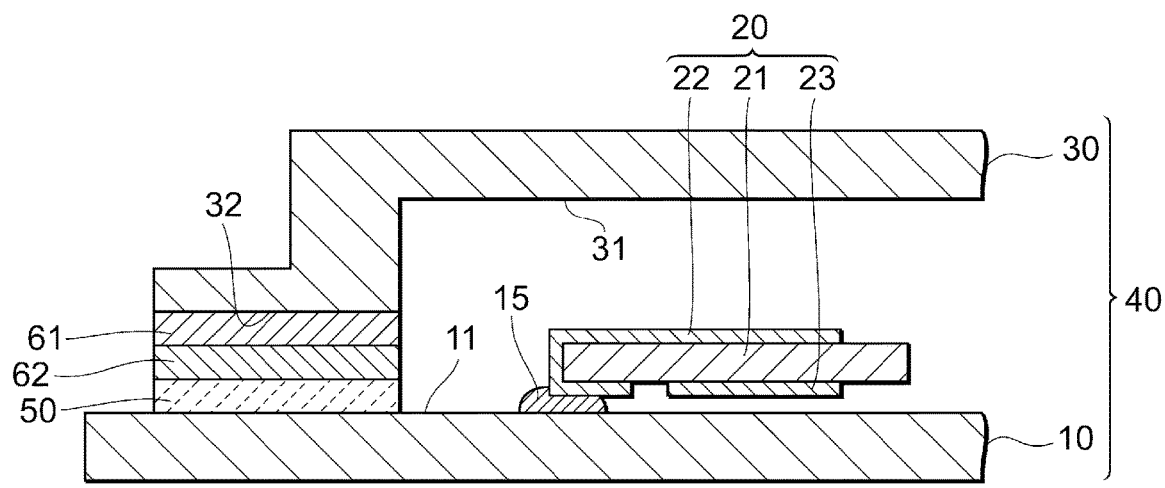
FIG. 8 is a partial sectional view of a process of manufacturing a piezoelectric vibration component according to a modification of an exemplary embodiment.

According to the exemplary aspect, the lid 30 is a closed-end lid member that hermetically seals the piezoelectric vibrator 20 from the outside air. As illustrated in FIG. 6, the lid 30 includes a recess 31, which opens toward the principal surface 11, and a framed edge portion 32, which surrounds the recess 31 in a substantially continuous rectangle. The recess 31 is a closed-end recess set back in the lid 30. The recess 31 has an opening area and an opening depth large enough to enclose the piezoelectric vibrator 20. The edge portion 32 serves as a surface of the lid 30 joined to the principal surface 11. According to a refinement of the exemplary embodiment, a modification is illustrated in FIG. 8 in which the edge portion 32 may have a flange shape that protrudes in a direction from the center of the opening of the recess 31 toward the opening edge. The lid 30 may be formed from a metal material, an insulating material (such as ceramics), or a composite (such as a composite formed by coating the surface of an insulating member with a metal thin film). In the exemplary aspect, the lid 30 is joined to the substrate 10 with a first insulating bonding layer 61 at the edge portion 32 and a second insulating bonding layer 62 superposed on the insulating film 50 interposed therebetween. The first and second insulating bonding layers 61 and 62 are not particularly limiting and may be any insulating adhesives including, for example, a nonconductive adhesive that cures with heat and that has bonding properties. Exemplary adhesives can include, for example, an epoxy-based adhesive containing an epoxy resin as a main component. Moreover, exemplary epoxy resins, can include, include a bifunctional epoxy resin, such as a bisphenol A epoxy resin or a bisphenol F epoxy resin, and a novolac epoxy resin, such as a phenolic novolac epoxy resin or a cresol novolac epoxy resin. Generally known epoxy resins such as a multifunctional epoxy resin, a glycidyl amine epoxy resin, a heterocycle containing epoxy resin, or an alicyclic epoxy resin are also usable. An epoxy-based adhesive used for the first and second insulating bonding layers 61 and 62 may contain a curing agent that facilitates curing of the epoxy resin. The curing agent has high low-temperature storage stability and thus hardly ever causes a curing reaction at room temperature. The curing agent rapidly causes a curing reaction with heat, light, or other factors. The first and second insulating bonding layers 61 and 62 may be the same or different. The lid 30 may be referred to as a cap, a cover, or a packaging member.

Figure 2:
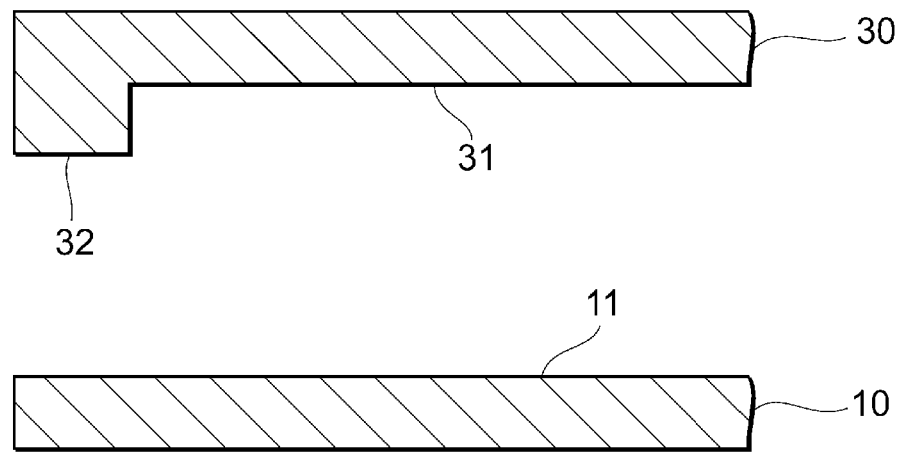
FIG. 2 is a partial sectional view of a process of manufacturing a piezoelectric vibration component according to an exemplary embodiment.
Figure 3:
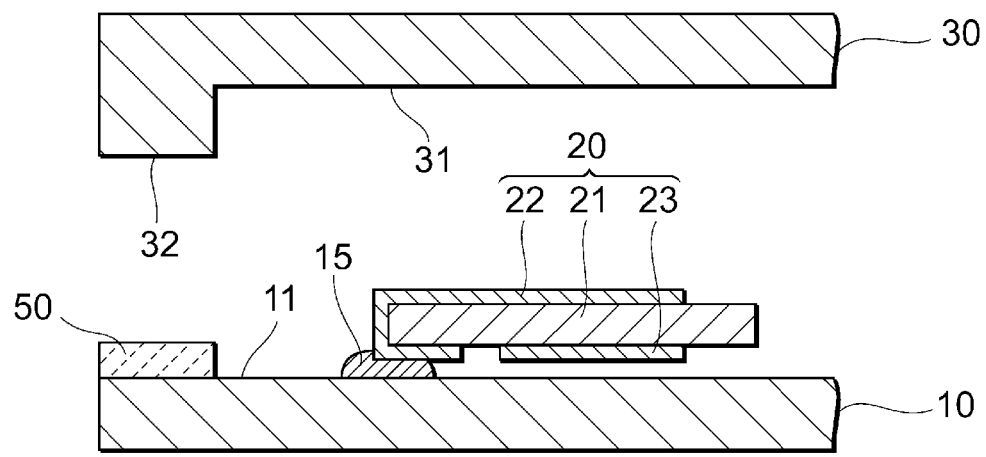
FIG. 3 is a partial sectional view of a process of manufacturing a piezoelectric vibration component according to an exemplary embodiment.

Exemplary processes of manufacturing the piezoelectric vibration component 40 are described now with reference to FIG. 2 to FIG. 6. As illustrated in FIG. 2, the substrate 10 and the lid 30 are prepared first. Then, as illustrated in FIG. 3, the insulating film 50 is formed on the principal surface 11 of the substrate 10. When a thin glass film is formed as the insulating film 50, glass paste may be printed on the principal surface 11 and then fired. The position at which the insulating film 50 is formed is adjusted so as to be aligned with the position of the edge portion 32 of the lid 30 joined to the principal surface 11. The piezoelectric vibrator 20 may be mounted on the principal surface 11 after the insulating film 50 is formed on the principal surface 11 or before the insulating film 50 is formed on the principal surface 11.

Figure 4:
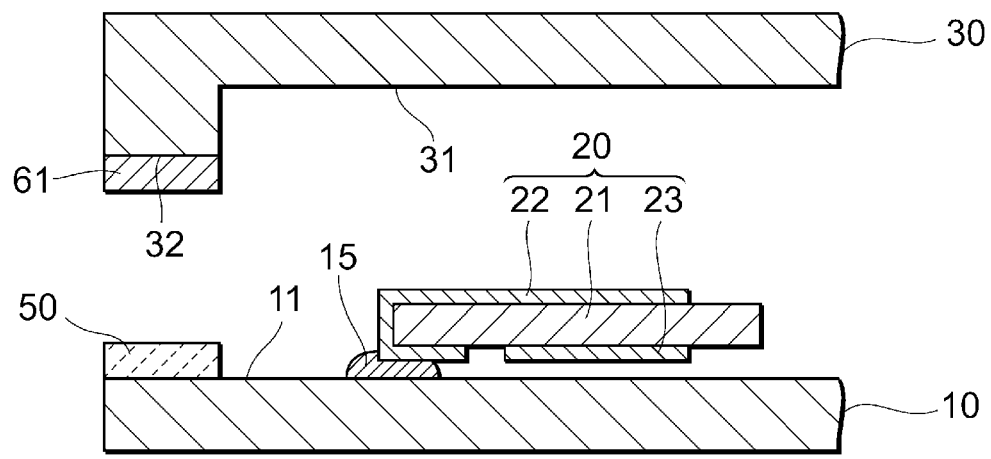
FIG. 4 is a partial sectional view of a process of manufacturing a piezoelectric vibration component according to an exemplary embodiment.

Subsequently, as illustrated in FIG. 4, the first insulating bonding layer 61 is formed at the edge portion 32 around the recess 31. Preferably, the first insulating bonding layer 61 is applied with a uniform thickness so as to uniformly spread over the edge portion 32. The first insulating bonding layer 61 is formed in a substantially continuous rectangle along the edge portion 32 and has substantially the same planar shape as the insulating film 50. The process of forming the first insulating bonding layer 61 may include a process of applying the first insulating bonding layer 61 in a liquid state to the edge portion 32 and a process of roughly curing the first insulating bonding layer 61 in the liquid state. Roughly curing refers to the state of gelatinizing with heat without solidifying. Specifically, roughly curing refers to semi-curing between the liquid state and the cured state. To temporarily cure the first insulating bonding layer 61, for example, a curing reaction may be forced to stop midway. Rendering the first insulating bonding layer 61 roughly cured in advance prevents the first insulating bonding layer 61 from dripping.

Figure 5:
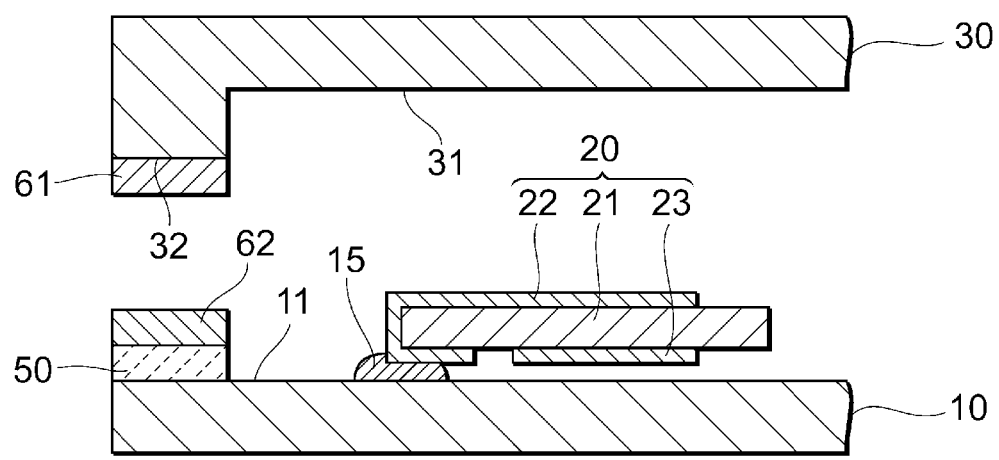
FIG. 5 is a partial sectional view of a process of manufacturing a piezoelectric vibration component according to an exemplary embodiment.
Figure 7:
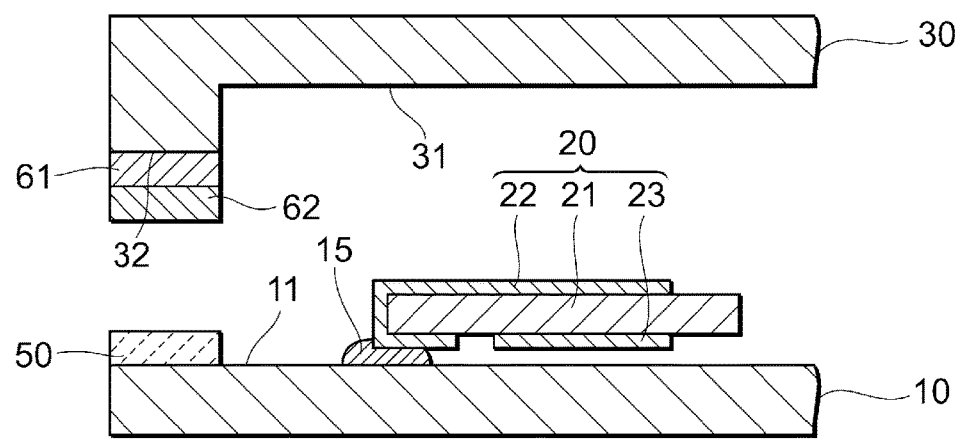
FIG. 7 is a partial sectional view of a process of manufacturing a piezoelectric vibration component according to a modification of an exemplary embodiment.

Subsequently, as illustrated in FIG. 5, the second insulating bonding layer 62 is superposed on the insulating film 50. The second insulating bonding layer 62 is formed in a substantially continuous rectangle along the insulating film 50 and has substantially the same planar shape as the first insulating bonding layer 61. The process of forming the second insulating bonding layer 62 includes a process of applying the second insulating bonding layer 62 in a liquid state to the insulating film 50 in a superposed manner and may exclude a process of roughly curing the insulating film 50. It should be appreciated that a form of the second insulating bonding layer 62 is not limited to the above form. For example, as illustrated in FIG. 7, the second insulating bonding layer 62 may be superposed on the first insulating bonding layer 61 at the edge portion 32 of the lid 30. Here, the first and second insulating bonding layers 61 and 62 may be each roughly cured before the substrate 10 and the lid 30 are joined together.

Subsequently, as illustrated in FIG. 6, the first insulating bonding layer 61 and the second insulating bonding layer 62 are joined together so that the piezoelectric vibrator 20 is hermetically sealed in a space between the recess 31 and the principal surface 11. In this joining process, the first insulating bonding layer 61 and the second insulating bonding layer 62 are bonded with pressure and then (or concurrently) heated to hasten intermolecular bond (cross-linking) and shift the first insulating bonding layer 61 and the second insulating bonding layer 62 to the cured state. At this time, the first insulating bonding layer 61 and the second insulating bonding layer 62 are bonded together at the interface therebetween while being slightly compressed in a direction perpendicular to the direction of pressure. Forming the first insulating bonding layer 61 at the edge portion 32 of the lid 30 in advance of forming the second insulating bonding layer 62 on the principal surface 11 of the substrate 10 allows the first insulating bonding layer 61 to deeply enter gaps between fine projections and depressions on the surface of the edge portion 32 and enhances the wettability or the affinity of the surface of the edge portion 32. This structure thus allows formation of a highly adhesive bonding interface between the edge portion 32 of the lid 30 and the first insulating bonding layer 61. When the first insulating bonding layer 61 cures while being in the gaps between fine projections and depressions on the surface of the edge portion 32, the lid 30 and the first insulating bonding layer 61 are bonded together with higher bonding strength with compound effects of anchor effect, van der Waals force, and other effects.

The exemplary embodiments described herein are provided for easy understanding of the present invention and not for limiting the present invention. The present invention can be changed or modified without departing from the scope of the invention and includes equivalents thereof.

REFERENCE SIGNS LIST 10 substrate
11 principal surface
12 conductive adhesive
13 wire
14 indentation
15 conductive adhesive
16 wire
17 indentation
20 piezoelectric vibrator
21 piezoelectric plate
22 excitation electrode
23 excitation electrode
30 lid
31 recess
32 edge
40 piezoelectric vibration component
50 insulating film
61 first insulating bonding layer
62 second insulating bonding layer

The invention claimed is:

1. A vibration component comprising:
a substrate having a principal surface;
a piezoelectric vibrator disposed on the principal surface of the substrate;
a plurality of wires disposed on the principal surface of the substrate;
a lid having an edge portion;
an insulating film disposed on the principal surface of the substrate, with the insulating film disposed between the edge portion of the lid and the plurality wires and provided to electrically insulate the plurality of wires from the lid; and
a first insulating bonding layer and a second insulating bonding layer interposed between the lid and the substrate,
wherein the first and second insulating bonding layers are joined together and disposed between the edge portion of the lid and the insulating film so as to seal the piezoelectric vibrator between the lid and the principal surface of the substrate.

2. A piezoelectric vibration component according to claim 1, wherein the edge portion of the lid has a same planar shape as the insulating film.

3. A piezoelectric vibration component according to claim 2, wherein the first insulating bonding layer has the same planar shape as the insulating film.

4. A piezoelectric vibration component according to claim 3, wherein the second insulating bonding layer has the same planar shape as the first insulating bonding layer.

5. A piezoelectric vibration component according to claim 1, wherein the insulating film includes a glass film.

6. A piezoelectric vibration component according to claim 1, wherein the lid has a recess opening facing the principal surface of the substrate, the edge portion extends around a periphery of recess opening, and the edge portion has a flange shape that extends outwardly from the edge portion.

7. A piezoelectric vibration component according to claim 1, wherein the piezoelectric vibrator comprises a flat piezoelectric plate having opposing surfaces, with a first excitation electrode disposed on a first surface of the opposing surfaces and a second excitation electrode disposed on a second surface of the opposing surfaces of the piezoelectric plate.

8. A piezoelectric vibration component according to claim 7, wherein the first excitation electrode is electrically coupled to a first wire of the plurality of wires and the second excitation electrode is electrically coupled to a second wire of the plurality of wires.

* * * * *